(12) United States Patent
Weimer et al.

(10) Patent No.: US 7,173,304 B2
(45) Date of Patent: Feb. 6, 2007

(54) METHOD OF MANUFACTURING DEVICES COMPRISING CONDUCTIVE NANO-DOTS, AND DEVICES COMPRISING SAME

(75) Inventors: Ronald A. Weimer, Boise, ID (US); Christopher Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 52 days.

(21) Appl. No.: 11/145,624

(22) Filed: Jun. 6, 2005

(65) Prior Publication Data

US 2006/0273376 A1    Dec. 7, 2006

(51) Int. Cl.
*H01L 21/336* (2006.01)
*H01L 29/76* (2006.01)

(52) U.S. Cl. .................. 257/315; 257/411; 438/257; 438/591

(58) Field of Classification Search ................ 257/314, 257/315, 410, 411; 438/211, 257, 260, 264, 438/591
See application file for complete search history.

(56) References Cited

U.S. PATENT DOCUMENTS

| | | | |
|---|---|---|---|
| 5,989,958 A | 11/1999 | Forbes | 438/257 |
| 6,574,144 B2 | 6/2003 | Forbes | 365/185.18 |
| 6,613,656 B2 | 9/2003 | Li | 438/584 |
| 6,790,727 B2 * | 9/2004 | Jones et al. | 438/257 |
| 6,809,025 B2 | 10/2004 | Sandhu et al. | 438/625 |
| 6,858,891 B2 | 2/2005 | Farnworth et al. | 257/296 |
| 6,913,984 B2 * | 7/2005 | Kim et al. | 438/432 |
| 6,949,793 B2 * | 9/2005 | Choi et al. | 257/316 |
| 7,105,425 B1 * | 9/2006 | Krivokapic | 438/481 |
| 2006/0205132 A1 * | 9/2006 | Bhattacharyya | 438/197 |

OTHER PUBLICATIONS

Hausmann et al., "Rapid Vapor Deposition of Highly Conformal Silica Nanolaminates," *Science*, 298:402-06, 2002.

* cited by examiner

*Primary Examiner*—T. N. Quach
(74) *Attorney, Agent, or Firm*—Williams, Morgan & Amerson, P.C.

(57) ABSTRACT

A method is disclosed that may include forming a first layer of insulating material above a semiconducting substrate, forming an aluminum oxide layer above the first layer of insulating material, forming a plurality of spaced-apart dots of material on the aluminum oxide layer, forming a second layer of insulating material on portions of the aluminum oxide layer not covered by the spaced-apart dots of material, forming a conductive layer above the second layer of insulating material and the plurality of spaced-apart dots of material, and removing excess portions of the layer of conductive material and the second layer of insulating material. A device is disclosed that may include a substrate and a floating gate electrode positioned above a tunnel insulation layer, the floating gate electrode including a layer of insulating material and a plurality of spaced-apart dots of material, each of which have a conductive nano-dot positioned on the dot of material, the dots of material and the conductive nano-dots being positioned in the layer of insulating material.

57 Claims, 6 Drawing Sheets

METHOD OF MANUFACTURING DEVICES COMPRISING CONDUCTIVE NANO-DOTS, AND DEVICES COMPRISING SAME

BACKGROUND OF THE INVENTION

1. Field of the Invention

The present invention is generally related to the field of manufacturing integrated circuit devices, and, more particularly, to a method of manufacturing devices comprising conductive nano-dots, and various semiconductor devices comprising same.

2. Description of the Related Art

There is a constant drive within the semiconductor industry to increase the operating speed of integrated circuit devices, e.g., memory devices, application specific integrated circuits (ASICs), and the like. This drive is fueled by consumer demands for computers and electronic devices that operate at increasingly greater speeds. This demand for increased speed has resulted in a continual reduction in the size of various features of the integrated circuit devices, e.g., transistors, word lines, etc. Thus, there is a constant drive to reduce the size, or scale, of the features of a typical memory device to increase the overall speed and capabilities of the memory device, as well as electronic devices incorporating such memory devices.

Scaling of various features of integrated circuit devices, e.g., memory devices, has advanced at a very rapid pace in recent years. In fact, critical dimensions of some features on such devices is approaching or exceeding the capability of deep-UV photolithography systems used in forming such features. Moreover, as device dimensions continue to shrink, some performance capabilities may be reduced. For example, extreme scaling of a floating gate on a traditional memory device may result in a floating gate structure that cannot store or maintain sufficient electrical charge such that the memory device may not operate as intended or at least not as efficiently.

Thus, device manufacturers are constantly exploring and developing new techniques to enable highly scaled devices to perform their intended function. As a specific example, it has been suggested that gate structures for a memory device contain a plurality of isolated silicon nano-dots surrounded by an insulating material to thereby improve the charge storage capability of such a structure as compared to a solid layer of polysilicon.

The present invention is directed to various methods and devices that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is generally directed to a method of manufacturing devices comprising conductive nano-dots, and various semiconductor devices comprising same. In one illustrative embodiment, the method comprises forming a first layer of insulating material above a semiconducting substrate, forming an aluminum oxide layer above the first layer of insulating material, forming a plurality of spaced-apart dots of material on the aluminum oxide layer, forming a second layer of insulating material on portions of the aluminum oxide layer not covered by the spaced-apart dots of material, forming a conductive layer above the second layer of insulating material and the plurality of spaced-apart dots of material, and removing excess portions of the layer of conductive material and the second layer of insulating material.

In another illustrative embodiment, the method comprises forming a first layer of insulating material above a semiconducting substrate, performing an atomic layer deposition process to deposit an aluminum oxide layer on the first layer of insulating material, depositing a plurality of spaced-apart silicon dots on the aluminum oxide layer, depositing a second layer of insulating material on portions of the aluminum oxide layer not covered by the spaced-apart silicon dots, depositing a conductive layer above the second layer of insulating material and the plurality of spaced-apart silicon dots, and performing a planarization process to remove excess portions of the layer of conductive material and the second layer of insulating material.

In yet another illustrative embodiment, the method comprises forming a first layer of insulating material above a semiconducting substrate, forming an aluminum oxide layer above the first layer of insulating material, forming a plurality of spaced-apart dots of material on the aluminum oxide layer, forming a second layer of insulating material on portions of the aluminum oxide layer not covered by the spaced-apart dots of material, removing the plurality of spaced-apart dots of material, after removing the plurality of spaced-apart dots of material, forming a conductive layer above the second layer of insulating material and on the aluminum oxide layer, and removing excess portions of the layer of conductive material and the second layer of insulating material.

In a further illustrative embodiment, the method comprises forming a first layer of insulating material above a semiconducting substrate, performing an atomic layer deposition process to deposit an aluminum oxide layer above the first layer of insulating material, depositing a plurality of spaced-apart silicon dots on the aluminum oxide layer, depositing a second layer of insulating material on portions of the aluminum oxide layer not covered by the plurality of spaced-apart silicon dots, removing the plurality of spaced-apart silicon dots, after removing the plurality of spaced-apart silicon dots, forming a conductive layer above the second layer of insulating material and on the aluminum oxide layer, and performing a planarization process to remove excess portions of the layer of conductive material and the second layer of insulating material.

In one illustrative embodiment, the device comprises a substrate and a floating gate electrode positioned above a tunnel insulation layer, the floating gate electrode including a layer of insulating material and a plurality of spaced-apart dots of material, each of which have a conductive nano-dot positioned on the dot of material, the dots of material and the conductive nano-dots being positioned in the layer of insulating material. In a further embodiment, the dots of material are comprised of silicon.

In another illustrative embodiment, the device comprises a substrate, a tunnel insulation layer, an aluminum oxide layer positioned above the tunnel insulation layer, and a floating gate electrode positioned above the aluminum oxide layer. The floating gate electrode comprises a layer of insulating material positioned above the aluminum oxide layer, and a plurality of spaced-apart conductive nano-dots positioned in the layer of insulating material and on the aluminum oxide layer.

In yet another illustrative embodiment, the transistor device comprises a substrate and a gate electrode positioned above a gate insulation layer, the gate electrode comprising a layer of insulating material and a plurality of spaced-apart dots of material, each of which have a conductive nano-dot positioned on the dot of material, the dots of material and the conductive nano-dots being positioned in the layer of insulating material.

In a further illustrative embodiment, the transistor device comprises a substrate, a gate insulation layer, an aluminum oxide layer positioned above the gate insulation layer, and a gate electrode positioned above the aluminum oxide layer. The gate electrode comprises a layer of insulating material positioned on the aluminum oxide layer and a plurality of spaced-apart conductive nano-dots positioned in the layer of insulating material and on the aluminum oxide layer.

BRIEF DESCRIPTION OF THE DRAWINGS

The invention may be understood by reference to the following description taken in conjunction with the accompanying drawings, in which like reference numerals identify like elements, and in which.

Figure 1:
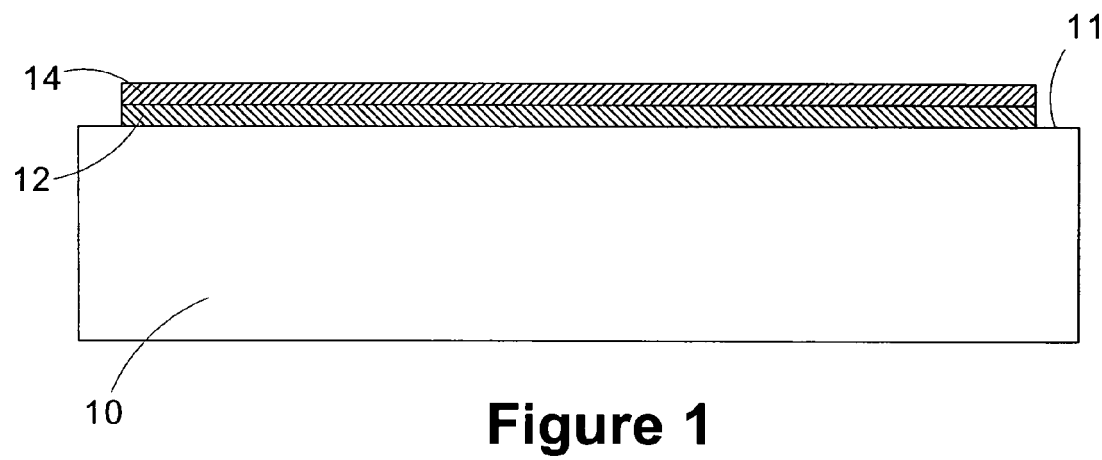
FIG. 1 is a cross-sectional view of an illustrative substrate having a plurality of layers formed thereabove in accordance with various aspects of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and structures depicted in the drawings may be exaggerated or reduced as compared to the size of those features or structures on fabricated devices. Nevertheless, the attached drawings are included to describe and explain illustrative examples of the present invention. The words and phrases used herein should be understood and interpreted to have a meaning consistent with the under-standing of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As indicated in FIG. 1, a layer of insulating material 12 is formed above the surface 11 of the semiconducting substrate 10. The substrate 10 may be any type of semiconducting material and it may take a variety of forms. For example, the substrate 10 may be a bulk silicon substrate or it may be a layer of epitaxial silicon. The substrate 10 may also be the active layer of an SOI substrate. The layer of insulating material 12 may be comprised of a variety of materials, e.g., silicon dioxide, and it may be formed by a variety of techniques, e.g., a thermal growth process, a chemical vapor deposition process, etc., and its thickness may vary depending upon the particular application, e.g., from 1–15 nm. In one particularly illustrative embodiment, the layer of insulating material 12 is a thermally grown layer of silicon dioxide that will constitute a so-called "tunnel oxide layer" or "tunnel insulation layer" for a memory device.

An aluminum oxide ($Al_2O_3$) layer 14 is formed above the layer of insulating material 12. The thickness of the aluminum oxide layer 14 may vary depending upon the particular application, e.g., 1–10 nm. The aluminum oxide layer 14 may be formed by a variety of known techniques. In one particularly illustrative embodiment, the aluminum oxide layer 14 may be formed by a chemical vapor deposition (CVD) process or an atomic layer deposition (ALD) process.

In one particularly illustrative embodiment, the aluminum oxide layer 14 may be formed in accordance with the techniques described in Baron et al., "Growth of Si nanocrystals on alumina and integration in memory devices," *Applied Physics Letters,* 82:4151–53, 2003, which is hereby incorporated by reference in its entirety. More specifically, the aluminum oxide layer 14 may be formed to a thickness of approximately 1 nm by performing an atomic layer deposition (ALD) process. One illustrative method of growing the aluminum oxide layer 14 is based upon the surface saturating reaction of trimethyl aluminum (TMA) and water at 300° C. The 1-nm thick layer of aluminum oxide may be formed in an ALD process using a few sequential cycles of TMA and water. The growth rate of the aluminum oxide layer 14 may be, in one illustrative embodiment, approximately 0.09 nm/cycle. Of course, other atomic layer deposition techniques and methods may be employed to form the aluminum oxide layer 14.

Figure 2A:
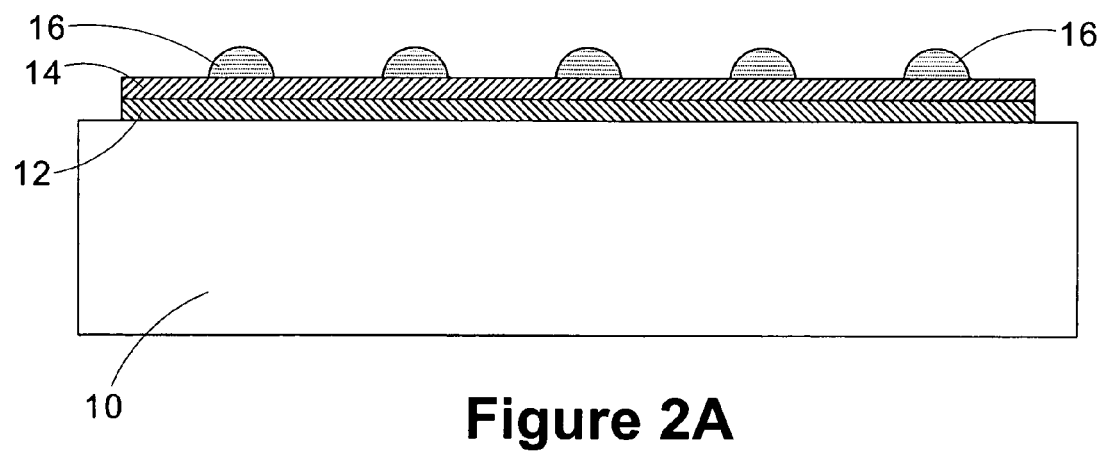
FIGS. 2A–2B are cross-sectional and plan views, respectively, depicting the formation of a plurality of silicon dots above the structure depicted in FIG. 1.
Figure 2B:
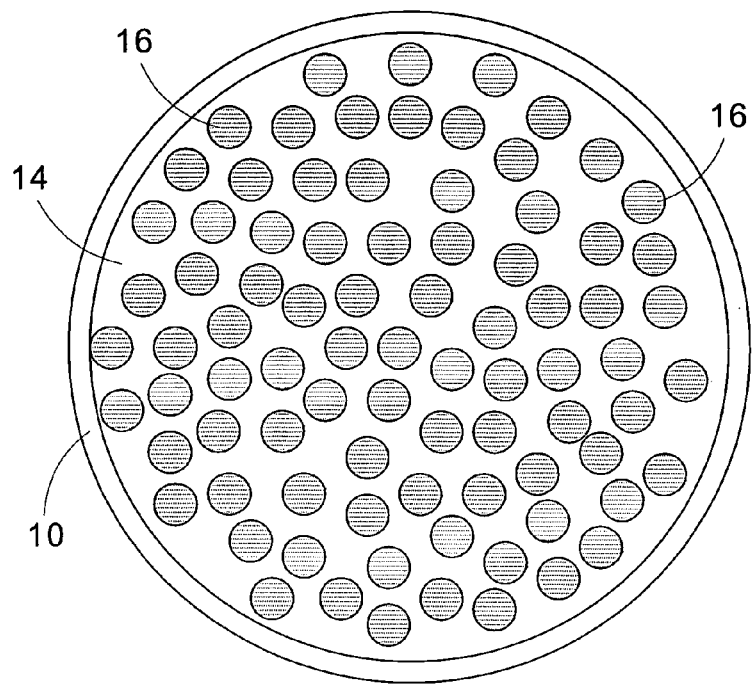

Next, as indicated in FIGS. 2A–2B, a plurality of dots of material 16 are formed on the aluminum oxide layer 14. FIG. 2A is a cross-sectional view and FIG. 2B is a plan view depicting the dots 16 formed above the aluminum oxide layer 14. As can be seen in FIG. 2B, the dots 16 are formed across the entirety of the surface of the aluminum oxide layer 14. The dots 16 may be comprised of a variety of materials. For example, in one illustrative embodiment, the dots of material 16 are comprised of silicon. For ease of reference, the remainder of the disclosure will refer to the dots 16 as silicon dots 16. However, as will be understood by those skilled in the art after a complete reading of the present application, the dots 16 may be comprised of a variety of materials. Thus, the present invention should not be considered as limited to any particular material for the dots 16.

The silicon dots 16 may be formed by performing a low pressure chemical vapor deposition (LPCVD) process using a precursor such as silane ($SiH_4$). In one illustrative example, the growth chamber pressure varies between 0.035–0.2 Torr whereby the temperature is increased from approximately 570–620° C. However, other parameters may also be employed. The silicon deposition process is controlled so as to avoid coalescence of the silicon dots and to deposit an approximately constant amount of silicon. The resulting silicon dots 16 have, in one illustrative embodiment, a dot density of approximately $9 \times 10^{11}$ dots/cm$^2$ ±1× $10^{11}$ dots/cm$^2$. Using the process described above, the density of the silicon dots 16 remains substantially constant at approximately $1 \times 10^{12}$ dots/cm$^2$. It also appears that the density of the silicon dots 16 may be independent of the process parameters (growth temperature, silane partial pressure) for an aluminum oxide surface. The size, shape and spacing of the silicon dots 16 may also vary depending upon the particular application. In one particularly illustrative embodiment, the silicon dots 16 may have a generally circular configuration and they may have an approximate diameter that ranges from 3–4 nm. In this illustrative example, the dots 16 may be randomly spaced and positioned on the aluminum oxide layer 14. For example, the spacing between adjacent dots may vary from approximately 3–5 nm. The height of the silicon dots 16 may vary depending upon the particular application.

Figure 3:
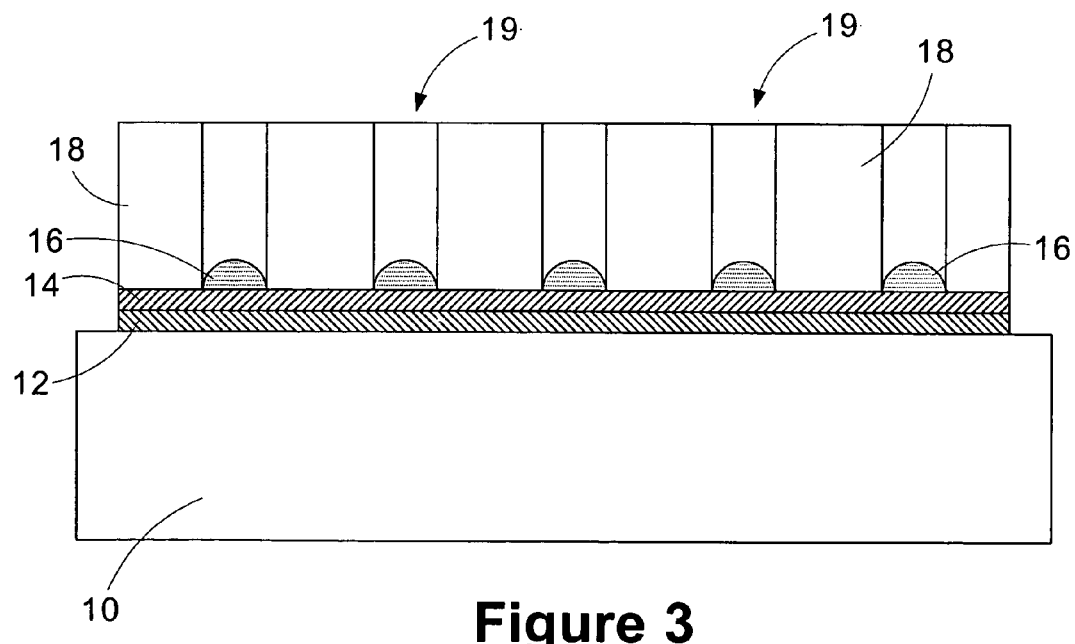
FIG. 3 is a cross-sectional view depicting the formation of a layer of insulating material above the structure depicted in FIGS. 2A–2B.

Next, as indicated in FIG. 3, a layer of insulating material 18 is formed on the aluminum oxide layer 14 between the silicon dots 16. The layer of insulating material 18 defines a plurality of openings 19 above the silicon dots 16. In one illustrative embodiment, the layer of insulating material 18 is comprised of silicon dioxide and it has a thickness that may vary from approximately 20–80 nm depending upon the particular application. The layer of insulating material 18 may be formed by a variety of techniques. In one illustrative embodiment, the layer of insulating material 18 may be formed by a pulsed, atomic layer deposition process as described in an article entitled "Rapid Vapor Deposition of Highly Conformal Silica Nanolaminates," by Dennis Haumann et al., which is hereby incorporated by reference in its entirety. More specifically, a heating process may be performed to raise the temperature of the layer of aluminum oxide 14 to approximately 100–300° C., and, in one particular example, to approximately 225–250° C. Then, vapors of trimethyl aluminum (TMA) ($Me_3Al$) and tris(tert-butoxy) silanol [$(Bu^tO)_3$ SiOH] or tris(tert-pentoxy)silanol may be supplied in alternating pulses to the heated surfaces of the layer of aluminum oxide 14 to form a layer of insulating material 18 comprised of alumina-doped silica. The thickness of the layer of alumina-doped silica may be controlled by regulating the size of the doses and the temperature. As an alternative, the ALD process may be performed using aluminum dimethyl amide [$Al_2$ ($NMe_2)_6$] in place of $Me_3Al$ and water to form an aluminum-containing material.

Figure 4:
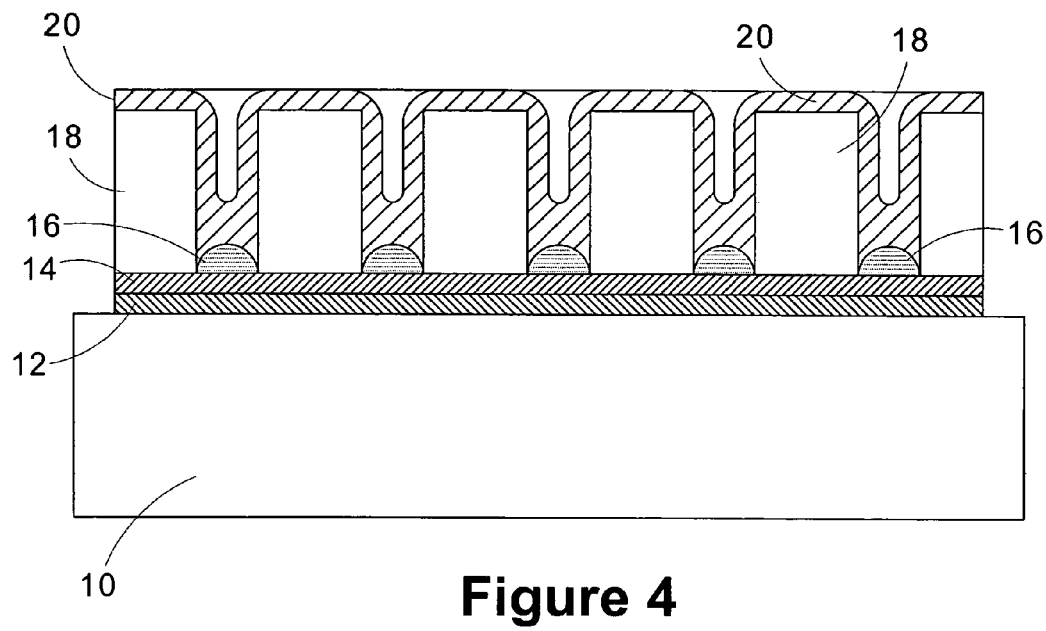
FIG. 4 is a cross-sectional view depicting the formation of a conductive layer above the structure depicted in FIG. 3.

Next, as indicated in FIG. 4, a layer of conductive material 20 is formed above the layer of insulating material 18 and in the openings 19 above the silicon dots 16. The layer of conductive material 20 may be comprised of, for example, a metal, polysilicon, etc., and its thickness may vary depending upon the particular application, e.g., from 0.5–1 nm. The layer of conductive material 20 may be formed by a variety of known processes, e.g., physical vapor deposition (PVD), atomic layer deposition (ALD), etc. In one particularly illustrative example, the layer of conductive material 20 is comprised of aluminum and it is conformally deposited using an atomic layer deposition process. If desired, a layer of insulating material (not shown) may be formed on the layer of conductive material 20. For example, a layer of silicon dioxide may be deposited on the layer of conductive material 20 by performing an atomic layer deposition process.

Figure 5:
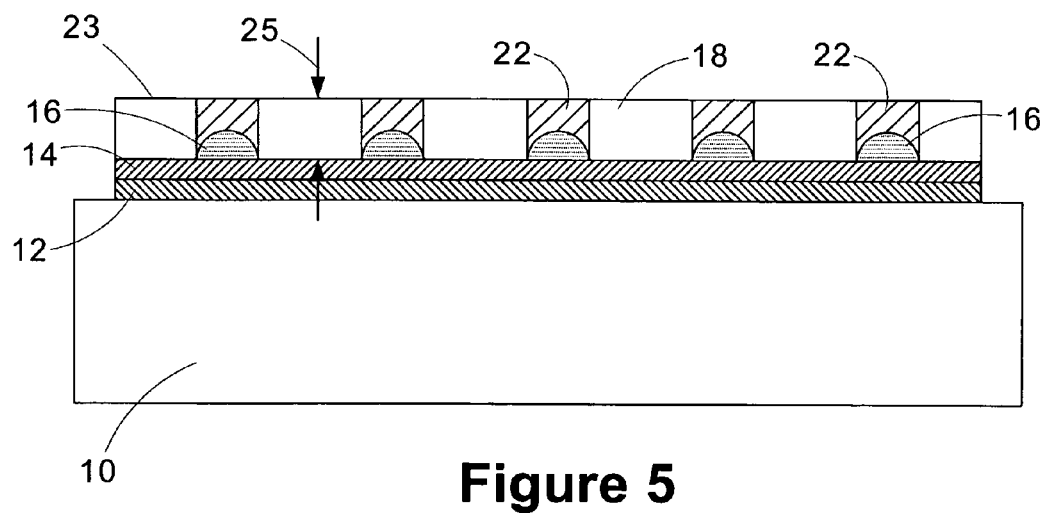
FIG. 5 depicts the structure of FIG. 4 after a planarization process has been performed.

Next, as indicated in FIG. 5, a planarization process is performed to produce a substantially planar surface 23 and to reduce the thickness of the layer 18 to a final desired thickness 25. In one illustrative embodiment, a chemical mechanical planarization (CMP) process is performed to planarize the surface 23. The structure depicted in FIG. 5 may also be achieved by performing one or more dry etch etching processes.

Figure 6:
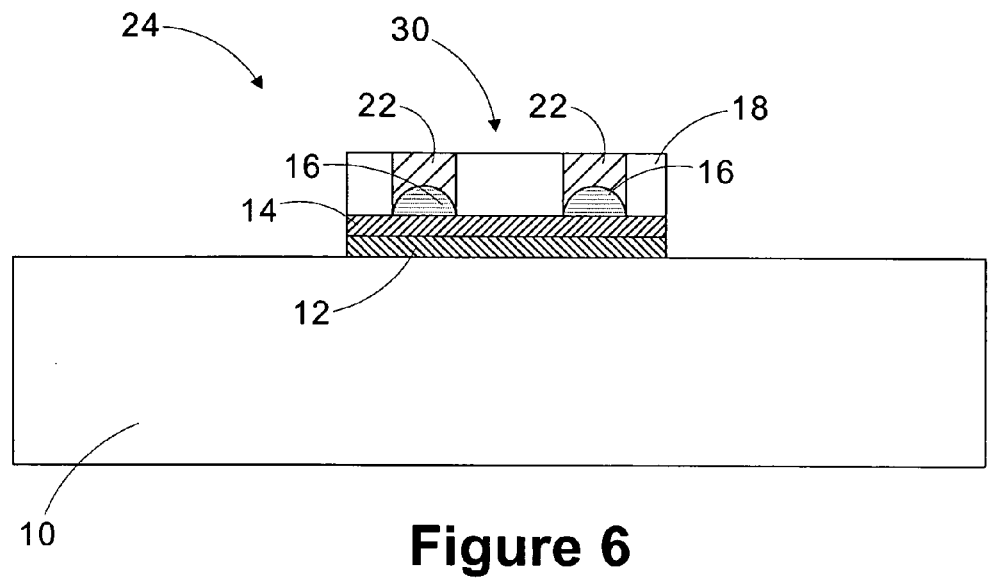
FIG. 6 is a cross-sectional view depicting an illustrative gate electrode structure that may be formed in accordance with illustrative aspects of the present invention.

FIG. 6 depicts an illustrative gate structure 24 of a semiconductor device, e.g., a memory device, a transistor, etc., that may be formed from the structure depicted in FIG. 5. For example, using known photolithography techniques and one or more etching processes, the structure depicted in FIG. 5 may be patterned to define a floating gate for a memory device, e.g., a flash memory device, or a gate electrode of a transistor. As indicated in FIG. 6, the gate structure 24 is comprised of a gate electrode 30, a layer of aluminum oxide 14 and a layer of insulating material 12. More specifically, the gate electrode 30 is comprised of the layer of insulating material 18 and a plurality of silicon dots 16, with a conductive nano-dot 20 positioned above each of the silicon dots 16. Of course, those skilled in the art will appreciate that other steps have to be taken to form a complete memory device or transistor. For example, such steps may include the formation of doped source and drain regions in the substrate 10, the formation of one or more sidewall spacers adjacent the gate structure 24, the formation of one or more metal silicide layers formed above the gate electrode and/or the source/drain regions, as well as the formation of a plurality of metallization layers that will define a conductive wiring pattern for the ultimate integrated circuit device. In the specific example of a memory device, a stack of insulating materials, e.g., an oxide-nitride-oxide (ONO) stack, may be formed above the gate electrode 30. Thereafter, a separate gate electrode, i.e., a so-called control gate electrode, may be formed above the ONO stack using known techniques and materials.

Figure 7:
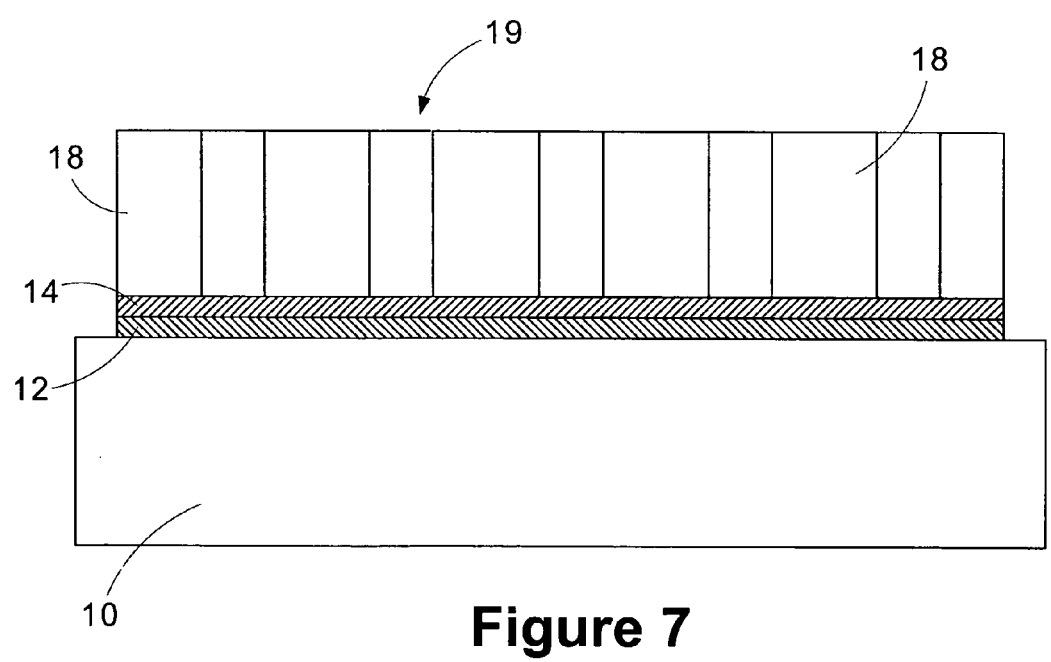
FIGS. 7–9 are cross-sectional views depicting an alternative embodiment of the present invention.
Figure 8:
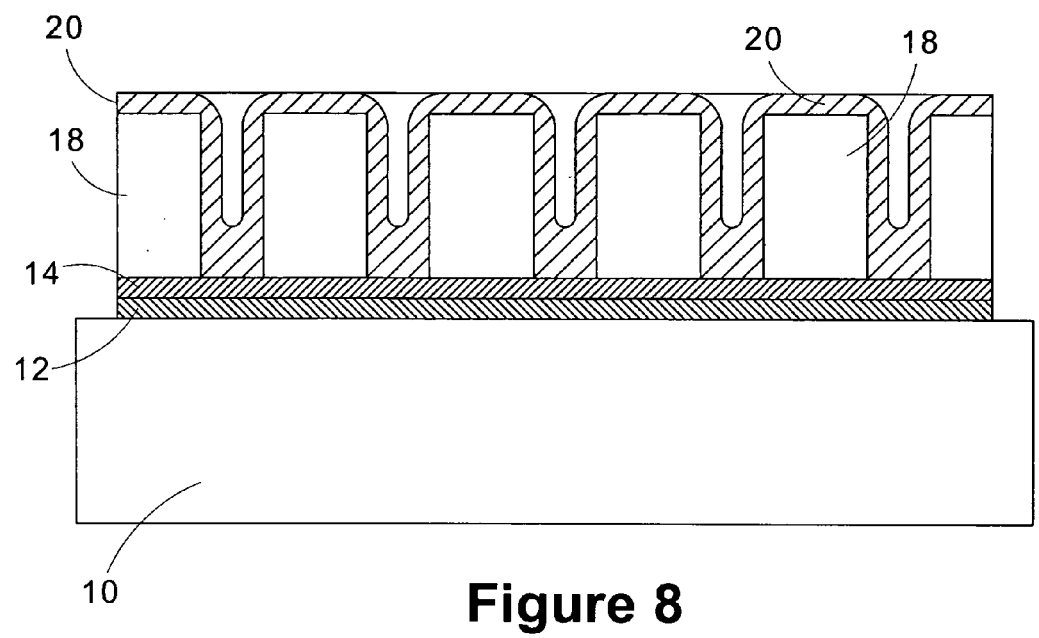
Figure 9:
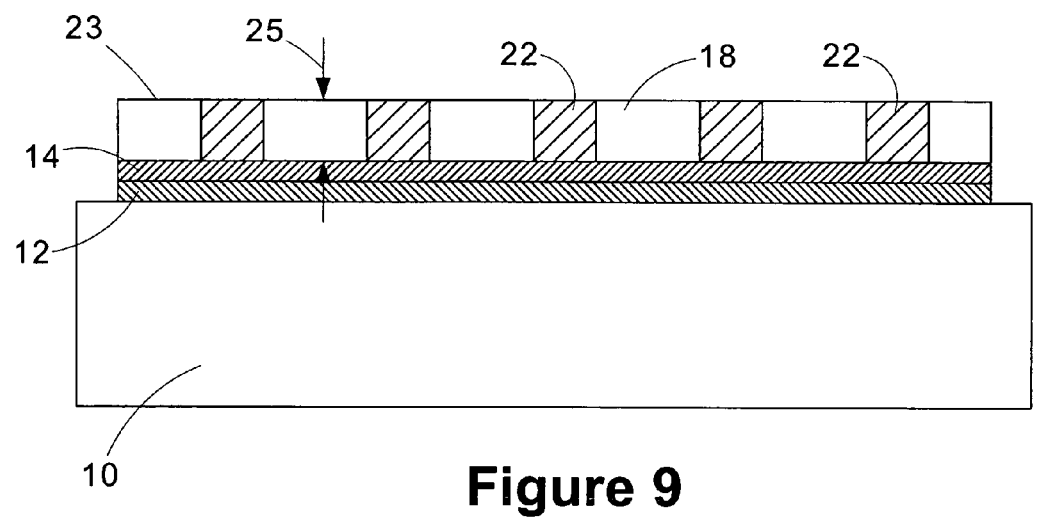
Figure 10:
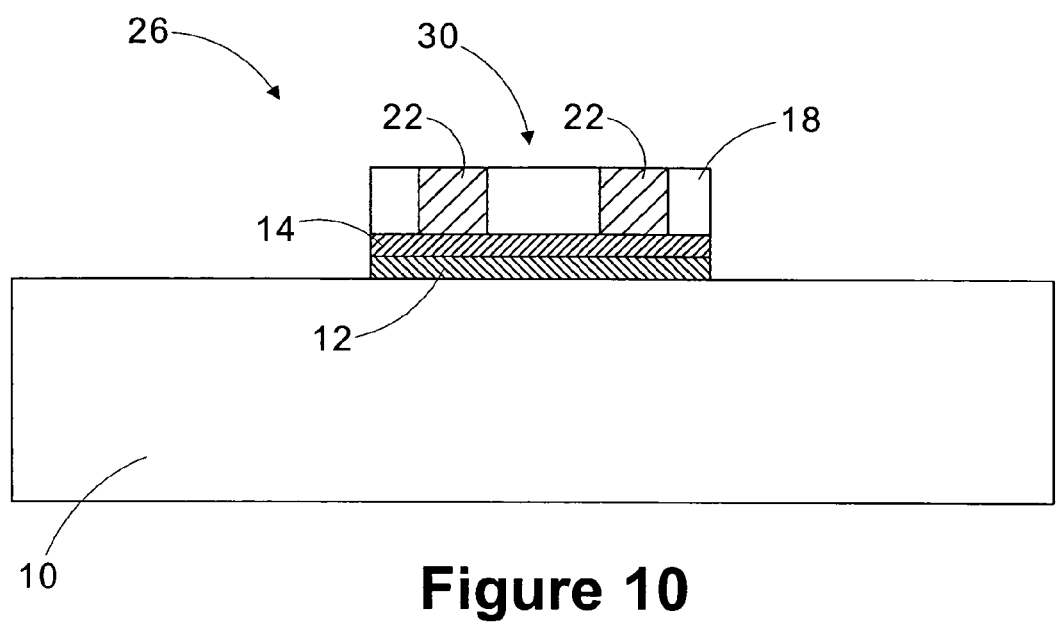
FIG. 10 is a cross-sectional view depicting an alternative embodiment of an illustrative gate electrode structure that may be formed in accordance with illustrative aspects of the present invention.

As an alternative, the silicon dots 16 may be removed after the formation of the layer of insulating material 18, as indicated in FIG. 7. If this alternative technique is employed, the silicon dots 16 may be removed by performing an etching process, e.g., a wet etching process, using an etch chemistry that selectively etches the silicon dots 16 relative to the layer of insulating material 18 and the underlying aluminum oxide layer 14. Then, as indicated in FIG. 8, the layer of conductive material 20 is formed above the layer of insulating material and in the openings 19 above the aluminum oxide layer 14. A planarization process is then performed to produce the structure depicted in FIG. 9. FIG. 10 depicts an illustrative gate structure 24 that results from performing known photolithography techniques and one or more etching processes. Note that, the gate electrode 30 depicted in FIG. 10 comprises the layer of insulating material 18 and a plurality of conductive nano-dots 20. As with the previous embodiment, if desired, a layer of insulating material (not shown) may be formed on the layer of conductive material 20 shown in FIG. 8.

The present invention is generally directed to a method of manufacturing devices comprising conductive nano-dots, and devices comprising same. In one illustrative embodiment, the method comprises forming a first layer of insulating material above a semiconducting substrate, forming an aluminum oxide layer above the first layer of insulating material, forming a plurality of spaced-apart dots of material on the aluminum oxide layer, forming a second layer of insulating material on portions of the aluminum oxide layer not covered by the spaced-apart dots of material, forming a conductive layer above the second layer of insulating material and the plurality of spaced-apart dots of material, and removing excess portions of the layer of conductive material and the second layer of insulating material. In further embodiments, the spaced-apart dots of material may be comprised of silicon. In additional embodiments, the act of removing excess portions of the layer of conductive material may be accomplished by performing a chemical mechanical planarization process or by performing a dry etching process.

In another illustrative embodiment, the method comprises forming a first layer of insulating material above a semiconducting substrate, performing an atomic layer deposition process to deposit an aluminum oxide layer on the first layer of insulating material, depositing a plurality of spaced-apart silicon dots on the aluminum oxide layer, depositing a second layer of insulating material on portions of the aluminum oxide layer not covered by the spaced-apart silicon dots, depositing a conductive layer above the second layer of insulating material and the plurality of spaced-apart silicon dots, and removing excess portions of the layer of conductive material and the second layer of insulating material.

In yet another illustrative embodiment, the method comprises forming a first layer of insulating material above a semiconducting substrate, forming an aluminum oxide layer above the first layer of insulating material, forming a plurality of spaced-apart dots of material on the aluminum oxide layer, forming a second layer of insulating material on portions of the aluminum oxide layer not covered by the spaced-apart dots of material, removing the plurality of spaced-apart dots of material, after removing the plurality of spaced-apart dots of material, forming a conductive layer above the second layer of insulating material and on the aluminum oxide layer, and removing excess portions of the layer of conductive material and the second layer of insulating material.

In a further illustrative embodiment, the method comprises forming a first layer of insulating material above a semiconducting substrate, performing an atomic layer deposition process to deposit an aluminum oxide layer above the first layer of insulating material, depositing a plurality of spaced-apart silicon dots on the aluminum oxide layer, depositing a second layer of insulating material on portions of the aluminum oxide layer not covered by the plurality of spaced-apart silicon dots, removing the plurality of spaced-apart silicon dots, after removing the plurality of spaced-apart silicon dots, forming a conductive layer above the second layer of insulating material and on the aluminum oxide layer, and performing a planarization process to remove excess portions of the layer of conductive material and the second layer of insulating material.

In one illustrative embodiment, the device comprises a substrate and a floating gate electrode positioned above a tunnel insulation layer, the floating gate electrode including a layer of insulating material and a plurality of spaced-apart dots of material, each of which have a conductive nano-dot positioned on the dot of material, the dots of material and the conductive nano-dots being positioned in the layer of insulating material. In further embodiments, the dots of material are comprised of silicon.

In another illustrative embodiment, the device comprises a substrate, a tunnel insulation layer, an aluminum oxide layer positioned above the tunnel insulation layer, and a floating gate electrode positioned above the aluminum oxide layer. The floating gate electrode comprises a layer of insulating material positioned above the aluminum oxide layer and a plurality of spaced-apart conductive nano-dots positioned in the layer of insulating material and on the aluminum oxide layer.

In yet another illustrative embodiment, the transistor device comprises a substrate and a gate electrode positioned above a gate insulation layer, the gate electrode comprising a layer of insulating material and a plurality of spaced-apart silicon dots, each of which have a conductive nano-dot positioned on the silicon dot, the silicon dots and the conductive nanodots being positioned in the layer of insulating material.

In a further illustrative embodiment, the transistor device comprises a substrate, a gate insulation layer, an aluminum oxide layer positioned above the gate insulation layer, and a gate electrode positioned above the aluminum oxide layer. The gate electrode comprises a layer of insulating material positioned on the aluminum oxide layer and a plurality of spaced-apart conductive nano-dots positioned in the layer of insulating material and on the aluminum oxide layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a first layer of insulating material above a semiconducting substrate;
    forming an aluminum oxide layer above said first layer of insulating material;
    forming a plurality of spaced-apart dots of material on said aluminum oxide layer;

forming a second layer of insulating material on portions of said aluminum oxide layer not covered by said spaced-apart dots of material;

forming a conductive layer above said second layer of insulating material and said plurality of spaced-apart dots of material; and removing excess portions of said layer of conductive material and said second layer of insulating material.

2. The method of claim 1, wherein forming a plurality of spaced-apart dots of material on said aluminum oxide layer comprises forming a plurality of spaced-apart silicon dots on said aluminum oxide layer.

3. The method of claim 1, wherein forming said first layer of insulating material above a semiconducting substrate comprises performing at least one of a deposition process and a thermal growth process to form said first layer of insulating material.

4. The method of claim 1, wherein forming said first layer of insulating material above a semiconducting substrate comprises forming said first layer of insulating material comprised of silicon dioxide above a semiconducting substrate.

5. The method of claim 1, wherein forming said aluminum oxide layer above said first layer of insulating material comprises performing an atomic layer deposition process to form said aluminum oxide layer above said first layer of insulating material.

6. The method of claim 1, wherein forming said plurality of spaced-apart dots of material on said aluminum oxide layer comprises performing a low pressure chemical vapor deposition process.

7. The method of claim 1, wherein forming said second layer of insulating material on portions of said aluminum oxide layer not covered by said spaced-apart dots of material comprises performing an atomic layer deposition process to form said second layer of insulating material.

8. The method of claim 1, wherein forming said second layer of insulating material on portions of said aluminum oxide layer not covered by said spaced-apart dots of material comprises forming a second layer of insulating material comprised of silicon dioxide on portions of said aluminum oxide layer not covered by said spaced-apart dots of material.

9. The method of claim 1, wherein forming a second layer of insulating material on portions of said aluminum oxide layer not covered by said spaced-apart dots of material comprises performing a pulsed, atomic layer deposition process to form said second layer of insulating material.

10. The method of claim 1, wherein forming said conductive layer above said second layer of insulating material and said plurality of spaced-apart dots of material comprises performing at least one of a physical vapor deposition process and an atomic layer deposition process to form said conductive layer above said second layer of insulating material and said plurality of spaced-apart dots of material.

11. The method of claim 1, wherein forming said conductive layer above said second layer of insulating material and said plurality of spaced-apart dots of material comprises forming a conductive layer comprised of at least one of polysilicon and a metal above said second layer of insulating material and said plurality of spaced-apart dots of material.

12. The method of claim 1, wherein removing excess portions of said layer of conductive material and said second layer of insulating material comprises performing at least one of a chemical mechanical planarization process and a dry etching process.

13. The method of claim 1, further comprising performing at least one etch process to define a gate electrode comprised of a plurality of said dots of material having a conductive nano-dot positioned above each of said dots of material positioned in said second layer of insulating material.

14. The method of claim 13, wherein said gate electrode is a floating gate for a memory device.

15. The method of claim 13, wherein said gate electrode is a gate electrode for a transistor.

16. A method, comprising:

forming a first layer of insulating material above a semiconducting substrate;

performing an atomic layer deposition process to deposit an aluminum oxide layer on said first layer of insulating material;

depositing a plurality of spaced-apart silicon dots on said aluminum oxide layer;

depositing a second layer of insulating material on portions of said aluminum oxide layer not covered by said spaced-apart silicon dots;

depositing a conductive layer above said second layer of insulating material and said plurality of spaced-apart silicon dots; and removing excess portions of said layer of conductive material and said second layer of insulating material.

17. The method of claim 16, wherein depositing said plurality of spaced-apart silicon dots on said aluminum oxide layer comprises performing a low pressure chemical vapor deposition process.

18. The method of claim 16, wherein depositing said second layer of insulating material on portions of said aluminum oxide layer not covered by said spaced-apart silicon dots comprises depositing a second layer of insulating material comprised of silicon dioxide on portions of said aluminum oxide layer not covered by said spaced-apart silicon dots.

19. The method of claim 16, wherein depositing said second layer of insulating material on portions of said aluminum oxide layer not covered by said spaced-apart dots of material comprises performing a pulsed, atomic layer deposition process to deposit said second layer of insulating material.

20. The method of claim 16, wherein removing excess portions of said layer of conductive material and said second layer of insulating material comprises performing at least one of a chemical mechanical planarization process and a dry etching process.

21. The method of claim 16, further comprising performing at least one etch process to define a gate electrode comprised of a plurality of said silicon dots having a conductive nano-dot positioned above each of said silicon dots positioned in said second layer of insulating material.

22. The method of claim 21, wherein said gate electrode is a floating gate for a memory device.

23. The method of claim 21, wherein said gate electrode is a gate electrode for a transistor.

24. A method, comprising:

forming a first layer of insulating material above a semiconducting substrate;

forming an aluminum oxide layer above said first layer of insulating material;

forming a plurality of spaced-apart dots of material on said aluminum oxide layer;

forming a second layer of insulating material on portions of said aluminum oxide layer not covered by said spaced-apart dots of material;

removing said plurality of spaced-apart dots of material;

after removing said spaced-apart dots of material, forming a conductive layer above said second layer of insulating material and on said aluminum oxide layer; and removing excess portions of said layer of conductive material and said second layer of insulating material.

25. The method of claim 24, wherein forming a plurality of spaced-apart dots of material on said aluminum oxide layer comprises forming a plurality of spaced-apart silicon dots on said aluminum oxide layer.

26. The method of claim 24, wherein forming said aluminum oxide layer above said first layer of insulating material comprises performing an atomic layer deposition process to form said aluminum oxide layer above said first layer of insulating material.

27. The method of claim 24, wherein forming said plurality of spaced-apart dots of material on said aluminum oxide layer comprises performing a low pressure chemical vapor deposition process.

28. The method of claim 24, wherein forming said second layer of insulating material on portions of said aluminum oxide layer not covered by said spaced-apart dots of material comprises performing a pulsed, atomic layer deposition process to form said second layer of insulating material.

29. The method of claim 24, wherein removing said plurality of spaced-apart dots of material comprises performing at least one etching process to remove said plurality of spaced-apart dots of material.

30. The method of claim 24, wherein removing excess portions of said layer of conductive material and said second layer of insulating material comprises performing at least one of a chemical mechanical planarization process and a dry etching process.

31. The method of claim 24, further comprising performing at least one etch process to define a gate electrode comprised of a plurality of conductive nano-dots positioned in said second layer of insulating material and on said aluminum oxide layer.

32. The method of claim 31, wherein said gate electrode is a floating gate for a memory device.

33. The method of claim 31, wherein said gate electrode is a gate electrode for a transistor.

34. A method, comprising:
forming a first layer of insulating material above a semiconducting substrate;
performing an atomic layer deposition process to deposit an aluminum oxide layer above said first layer of insulating material;
depositing a plurality of spaced-apart silicon dots on said aluminum oxide layer;
depositing a second layer of insulating material on portions of said aluminum oxide layer not covered by said spaced-apart silicon dots;
removing said spaced-apart silicon dots;
after removing said plurality of spaced-apart silicon dots, forming a conductive layer above said second layer of insulating material and on said aluminum oxide layer; and
removing excess portions of said layer of conductive material and said second layer of insulating material.

35. The method of claim 34, wherein forming said conductive layer above said second layer of insulating material and on said aluminum oxide layer comprises forming a conductive layer comprised of at least one of polysilicon and a metal above said second layer of insulating material and on said aluminum oxide layer.

36. The method of claim 34, wherein depositing said second layer of insulating material on portions of said aluminum oxide layer not covered by said spaced-apart dots of material comprises performing a pulsed, atomic layer deposition process to deposit said second layer of insulating material.

37. The method of claim 34, further comprising performing at least one etch process to define a gate electrode comprised of a plurality of conductive nano-dots positioned in said second layer of insulating material and on said aluminum oxide layer.

38. The method of claim 37, wherein said gate electrode is a floating gate for a memory device.

39. The method of claim 37, wherein said gate electrode is a gate electrode for a transistor.

40. A memory device, comprising:
a substrate; and
a floating gate electrode positioned above a tunnel insulation layer, said floating gate electrode comprising:
a layer of insulating material, and
a plurality of spaced-apart dots of material, each of which have a conductive nano-dot positioned on said dot of material, said dots of material and said conductive nano-dots being positioned in said layer of insulating material.

41. The device of claim 40, wherein said dots of material are comprised of silicon.

42. The device of claim 40, further comprising an aluminum oxide layer positioned between said floating gate electrode and said tunnel insulation layer.

43. The device of claim 40, wherein said conductive nano-dots are comprised of at least one of polysilicon and a metal.

44. The device of claim 40, wherein said layer of insulating material is comprised of silicon dioxide.

45. The device of claim 40, wherein said substrate comprises silicon.

46. The device of claim 40, wherein said tunnel insulation layer is comprised of silicon dioxide.

47. A memory device, comprising:
a substrate;
a tunnel insulation layer positioned above said substrate;
an aluminum oxide layer positioned above said tunnel insulation layer; and
a floating gate electrode positioned above said aluminum oxide layer, said floating gate electrode comprising:
a layer of insulating material, and
a plurality of spaced-apart conductive nano-dots positioned in said layer of insulating material and on said aluminum oxide layer.

48. The device of claim 47, wherein said conductive nano-dots are comprised of at least one of polysilicon and a metal.

49. The device of claim 47, wherein said layer of insulating material is comprised of silicon dioxide.

50. The device of claim 47, wherein said substrate comprises silicon.

51. A transistor device, comprising:
a substrate; and
a gate electrode positioned above a gate insulation layer, said gate electrode comprising:
a layer of insulating material, and
a plurality of spaced-apart dots of material, each of which have a conductive nano-dot positioned on said dot of material, said dots of material and said conductive nano-dots being positioned in said layer of insulating material.

52. The device of claim 51, wherein said dots of material are comprised of silicon.

53. The device of claim 51, further comprising an aluminum oxide layer positioned between said gate electrode and said gate insulation layer.

54. The device of claim 51, wherein said conductive nano-dots are comprised of at least one of polysilicon and a metal.

55. The device of claim 51, wherein said layer of insulating material is comprised of silicon dioxide.

56. The device of claim 51, wherein said substrate comprises silicon.

57. A transistor device, comprising:
a substrate;
a gate insulation layer positioned above said substrate;
an aluminum oxide layer positioned above said gate insulation layer; and
a gate electrode positioned above said aluminum oxide layer, said gate electrode comprising:
    a layer of insulating material positioned on said aluminum oxide layer, and
    a plurality of spaced-apart conductive nano-dots positioned in said layer of insulating material and on said aluminum oxide layer.

\* \* \* \* \*